United States Patent
Sanchez et al.

(10) Patent No.: US 7,317,345 B2
(45) Date of Patent: Jan. 8, 2008

(54) ANTI-GATE LEAKAGE PROGRAMMABLE CAPACITOR

(75) Inventors: Hector Sanchez, Cedar Park, TX (US); Xinghai Tang, Cedar Park, TX (US)

(73) Assignee: Freescale Semiconductor, Inc., Austin, TX (US)

(*) Notice: Subject to any disclaimer, the term of this patent is extended or adjusted under 35 U.S.C. 154(b) by 49 days.

(21) Appl. No.: 11/069,537

(22) Filed: Mar. 1, 2005

(65) Prior Publication Data

US 2006/0197563 A1    Sep. 7, 2006

(51) Int. Cl.
*H03L 7/06*    (2006.01)
(52) U.S. Cl. .................................... 327/527; 327/148
(58) Field of Classification Search ................ 327/156, 327/157, 147, 148, 337, 536
See application file for complete search history.

(56) References Cited

U.S. PATENT DOCUMENTS

| | | | | |
|---|---|---|---|---|
| 5,051,881 A | * | 9/1991 | Herold | 363/60 |
| 5,426,383 A | * | 6/1995 | Kumar | 326/119 |
| 5,506,528 A | * | 4/1996 | Cao et al. | 327/108 |
| 5,534,819 A | * | 7/1996 | Gunter et al. | 327/553 |
| 5,544,102 A | * | 8/1996 | Tobita et al. | 365/189.09 |
| 5,905,398 A | * | 5/1999 | Todsen et al. | 327/337 |
| 6,028,488 A | | 2/2000 | Landman et al. | |
| 6,057,739 A | | 5/2000 | Crowley et al. | |
| 6,388,536 B1 | | 5/2002 | Welland | |
| 6,624,668 B1 | * | 9/2003 | Robinson et al. | 327/103 |
| 6,624,674 B1 | | 9/2003 | Zhao | |
| 6,670,861 B1 | * | 12/2003 | Balboni | 332/103 |
| 6,693,496 B1 | | 2/2004 | Lebouleux | |
| 6,844,762 B2 | * | 1/2005 | Sanchez | 327/157 |
| 6,954,091 B2 | * | 10/2005 | Wurzer | 327/156 |

OTHER PUBLICATIONS

A new fast-settling gearshift adaptive PLL to extend loop bandwidth enhancement in frequency synthesizers Yiwu Tang; Ismail, M.; Bibyk, S.; Circuits and Systems, 2002. ISCAS 2002L IEEE International Symposium on, vol. 4, May 26-29, 2002 pp. IV-787-IV-790 vol. 4.

(Continued)

*Primary Examiner*—Kenneth B. Wells
*Assistant Examiner*—Hai L. Nguyen
(74) *Attorney, Agent, or Firm*—Gary R. Stanford

(57) ABSTRACT

An anti-gate leakage programmable capacitor including at least one capacitor having a first terminal coupled to a first node and a second terminal, a second node, and a control circuit which selectively couples the second terminal of the capacitor to the second node or which drives the second terminal to the same voltage as the first node. In one embodiment, the programmable capacitor includes multiple capacitors, an amplifier having an input coupled to the first node and an output, and a switch circuit coupled to the second node, to each second terminal of each capacitor and to the amplifier output. The switch circuit selectively switches each second terminal of each capacitor between the amplifier output and the second node. The switch circuit may include pairs of switches each controlled by a corresponding select signal to selectively switch a corresponding capacitor between the reference node and the output of the amplifier.

20 Claims, 2 Drawing Sheets

OTHER PUBLICATIONS

A low-noise fast-lock phase-locked loop with adaptive bandwidth control Joonsuk Lee; Beomsup Kim; Solid-State Circuits, IEEE Journal of, vol. 35, Issue: 8, Aug. 2000 pp. 1137-1145.

Fast locking scheme for PLL frequency synthesiser Liu, L.C.; Li, B.H.; Electronic Letters, vol. 40, Issue: 15, Jul. 22, 2004 pp. 918-920.

A CMOS PLL using current-adjustable charge-pump and on-chip loop filter with initialization circuit; Zhao Hui; Ren Junyan, Zhang Qianling; ASIC, 2003. Proceedings. 5th International Conference on, vol. 2, Oct. 21-24, 2003 pp. 728-731 vol. 2.

Methodology for on-chip adaptive jitter minimization in phase-locked loops; Mansuri, M.; Hadiashar, A.; Chih-Kong Ken Yang; Circuits and Systems II: Analog and Digital Signal Processing, IEEE Transactions on [see also Circuits and Systems II: Express Briefs, IEEE Transactions on], vol. 50, Issue: 11, Nov. 2003 pp. 870-878.

\* cited by examiner

ANTI-GATE LEAKAGE PROGRAMMABLE CAPACITOR

BACKGROUND OF THE INVENTION

1. Field of the Invention

The present invention relates in general to electronic devices and more specifically to a programmable capacitor with minimized gate leakage for use in electronic circuits including phase-locked loops (PLLs) and the like.

2. Description of the Related Art

The transistors implemented using advanced CMOS processes, such as 90-nm (nanometer) CMOS, are exhibiting non-ideal behavioral traits for implementation of the critical analog functions used in various electronic devices, such as current and voltage sources or references, voltage-controlled oscillators (VCOs), charge pumps, filters, etc. Some of these non-ideal transistor traits include increased gate tunneling current, increased drain-source leakage, reduced voltage headroom due to VDD scaling, and increased noise susceptibility due to decreased threshold voltages. The drive to reduce the size of electronic devices has increased the difficulty of implementing capacitors in a semiconductor device. In particular, reducing the thickness of gate oxides increases the gate leakage currents of a capacitor implemented in the semiconductor device. Many functions use a programmable filter with selectable components, such as selectable capacitors, which are digitally selectable using CMOS transistor switches or pass gate switches or the like. The electronic switches tend to leak current when switched off effectively modifying the effective capacitance and compromising intended circuit functionality.

The conventional phase locked loop (PLL) architecture, for example, is not ideal for newer process technologies, does not scale well from one process technology to the next, and must be redesigned for use in various electronic devices in different markets. Furthermore, with respect to PLL design, the very high gain VCOs are causing increased cycle-to-cycle jitter, coupled with increased phase drift due to the ever increasing discrepancy between the internal speed of the processor and the interface reference clock speeds. Modern processors, for example, typically operate in the gigahertz (GHz) range whereas the interface reference clock speeds typically operate in the 16-166 megahertz (MHz) range. Fully digital PLLs can alleviate some of the issues but do not scale very well. Furthermore, the need to integrate more PLLs on chip for System-On-Chip (SOC) applications forces more unique PLL implementations which cause design overhead and risk. The PLL includes a charge pump which generates a control voltage across a filter capacitor, where the control voltage is provided to the VCO for synchronizing frequency and/or phase. It is desired to provide a charge pump with a programmable PLL using electronic switching. Electronic switch gate leakage has compromised programmable filter functionality.

It is desired to provide a programmable filter implemented with newer technologies and for various applications. It is desired to eliminate or otherwise mitigate the effects of gate leakage of electronic devices.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
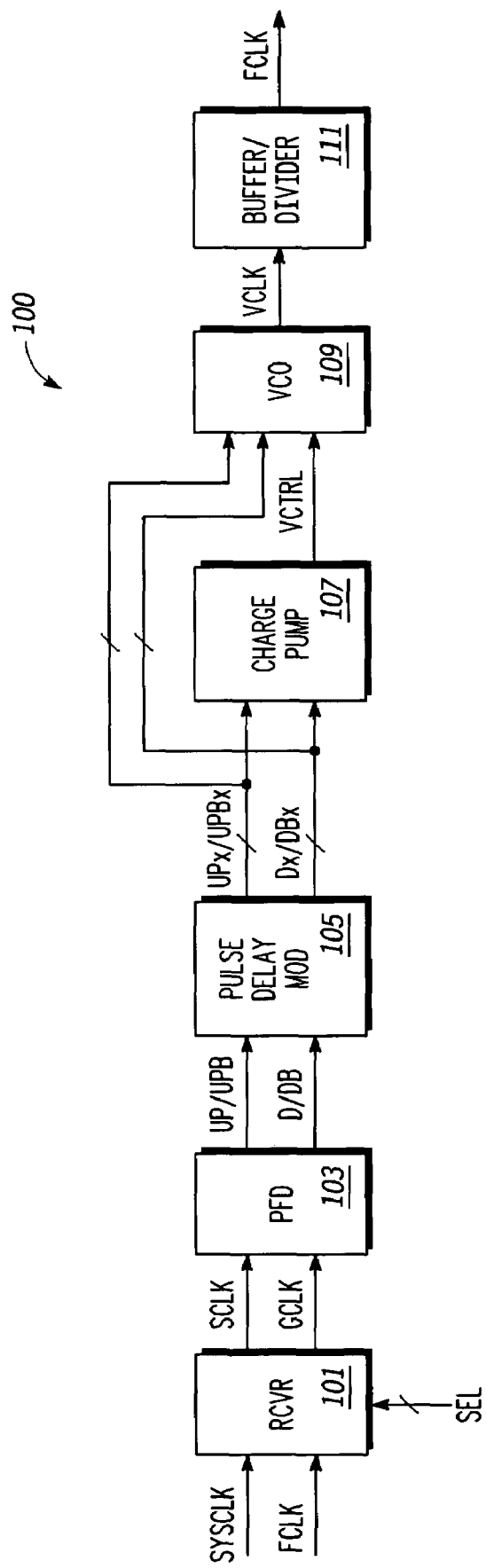
FIG. 1 is a block diagram of a phase locked loop illustrating an exemplary application in which it is desired to use a programmable capacitor implemented according to an embodiment of the present invention.

FIG. 1 is a block diagram of a phase locked loop (PLL) illustrating an exemplary application in which it is desired to use a programmable capacitor 203 (FIG. 2) implemented according to an embodiment of the present invention. The PLL 100 includes an output for providing an output clock signal (FCLK) that may be at the same frequency, a fractional frequency, or multiple frequency of a reference or system clock signal referred to as SYSCLK. The SYSCLK and FCLK signals are provided to respective inputs of a receiver (RCVR) circuit 101 at the input of the PLL 100. The receiver circuit 101 selectively shifts the level of the SYSCLK signal down to the level of the FCLK signal, as further described below, and provides equal level clock signals SCLK and GCLK, respectively. The receiver circuit 101 also provides programmable skew control between the SYSCLK and FCLK signals, although such skew control is not further described as not necessary for a full understanding of the present invention. In the embodiment shown in FIG. 1, the receiver circuit 101 receives one or more select signals SEL, which are employed to shift the voltage level of the SYSCLK signal relative to the FCLK signal as further described below. The SCLK and GCLK signals are provided to respective inputs of a phase frequency detector (PFD) circuit 103. Based upon a comparison of the SCLK and GCLK signals, the PFD circuit 103 generates up (UP) and down (D) clock control signals, which collectively indicate the frequency and phase relationship between the SCLK and GCLK signals as understood by those of ordinary skill in the art. The PFD circuit 103 also generates and provides inverse versions of the UP and D signals, shown as UPB and DB signals, respectively, where a "B" appended at the end of a signal name denotes logical negation or signal inversion unless otherwise indicated.

The UP/UPB and D/DB signals are provided to a pulse delay modulation circuit 105, which generates and provides multiple up signals UPx and UPBx and multiple down signals Dx and DBx. The "x" appended to the signal name denotes an index value from zero (0) to a number "N", where N is any integer value selected for the particular implementation or configuration. Thus, for example, if N is 2, then x is 0, 1 and 2, and the pulse delay modulation circuit 105 generates up and down complementary signal pairs UP0/

UPB0 and D0/DB0, UP1/UPB1 and D1/DB1, and UP2/UPB2 and D2/DB2. In the embodiment shown, the UP/UPB and D/DB effectively pass unmodified through the pulse delay modulation circuit 105 and become the UP0/UPB0 and D0/DB0 signals. If N is 0, then the pulse delay modulation circuit 105 is not provided or otherwise generates up and down complementary signal pairs UP0/UPB0 and D0/DB0, or simply UP/UPB and D/DB. One or more sets of the complementary signal pairs (e.g., UP0/UPB0 and D0/DB0) are provided to a capacitive charge pump 107, which generates a frequency control signal VCTRL across a filter capacitor (e.g., selected combination of capacitors 207, 209, 215 of FIG. 2) for adjusting the frequency of the FCLK signal. In general, the charge pump 107 applies charge to the filter capacitor in response to asserted up signals and removes charge from the filter capacitor in response to asserted down signals. The VCO 109 receives the VCTRL signal and provides at its output a clock signal VCLK having a frequency that is controlled by the voltage level of the VCTRL signal. The UPx, UPBx, Dx and DBx clock control signals are also provided to the VCO 109 for phase control of the VCLK signal, as further described below. In the embodiment of FIG. 1, the VCLK signal is provided to a buffer and frequency divider circuit 111 that selectively divides the frequency of VCLK to produce the output FCLK signal fed back to the input of the PLL 100.

In one embodiment, the PLL 100 is implemented in an integrated circuit (IC) utilizing CMOS technology including advanced CMOS processing technology. The PLL 100 is optionally integrated with other devices which utilize the PLL 100 such as, for example, a processor and any other processor support circuitry (not shown). With other embodiments, the circuits of the PLL 100 are optionally implemented with other types of circuitry including, for example, with silicon on insulator (SOI) transistors or with discrete components. In one embodiment, the PLL 100 is implemented as a single, fully programmable PLL with improved level-shifting and phase correction for advanced CMOS technologies, such as 90-nm CMOS and the like, and is particularly useful for multiple purpose SOC architectures.

Figure 2:
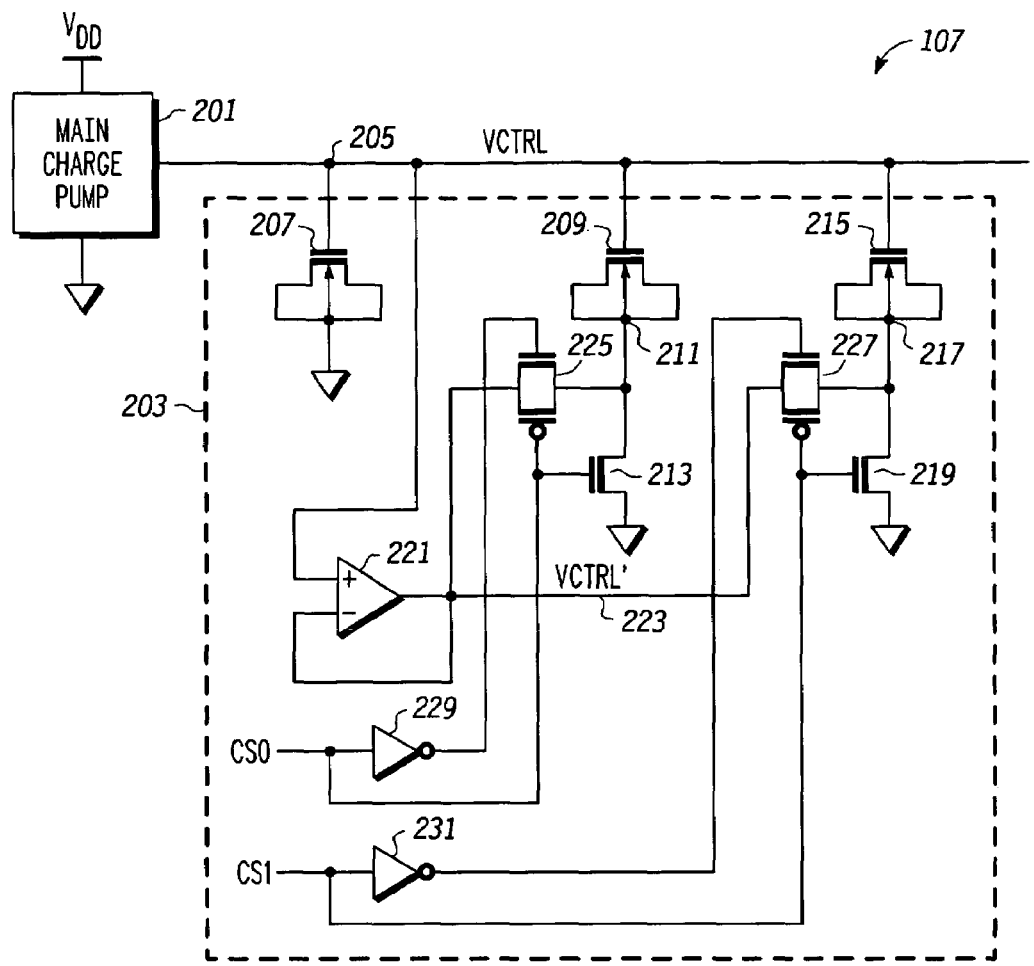
FIG. 2 is a more detailed schematic and block diagram of an exemplary embodiment of the charge pump of FIG. 1 including the programmable capacitor which is implemented according to an exemplary embodiment of the present invention.

FIG. 2 is a more detailed schematic and block diagram of an exemplary embodiment of the charge pump 107 including the programmable capacitor 203 implemented according to an exemplary embodiment of the present invention. The charge pump 107 includes a main charge pump 201 and a programmable capacitor 203. The main charge pump 107 may be implemented in any one of a variety of ways and is not further described herein. For example, the main charge pump 201 may be implemented as described in U.S. Pat. No. 6,844,762 entitled "Capacitive Charge Pump" issued Jan. 18, 2005. The main charge pump 201 generates the VCTRL voltage on a node 205, which is coupled to multiple capacitors 207, 209 and 215 provided within the programmable capacitor 203. The capacitor 207 is shown as "fixed" and permanently coupled between node 205 and ground (GND) in the embodiment shown. The "programmable" capacitors 209 and 215, however, are switched and thus selectively coupled into the circuit by N-channel transistors 213 and 219, respectively.

The capacitor 207 is shown as an NMOS transistor having its source, drain and substrate coupled together at ground. The capacitor 209 is shown as an NMOS transistor having its source, drain and substrate coupled together at a node 211 resulting in a capacitance between its gate and the common node 211 as known to those skilled in the art. The capacitor 215 is configured in a similar manner and shown as an NMOS transistor having its source, drain and substrate coupled together at a node 217 forming a capacitance between its gate and the common node 217. The node 211 of capacitor 209 is coupled to the drain of the transistor 213, having its source coupled to ground and its gate receiving a capacitor select signal CS0. The node 217 of capacitor 215 is coupled to the drain of the transistor 213, having its source coupled to ground and its gate receiving another capacitor select signal CS1. The transistors 213 and 219 are turned on when the CS0 and CS1 signals, respectively, are asserted high and each is turned off when the respective select signal is asserted low. In one embodiment, the transistors 213 and 219 are configured as relatively large devices with a relatively small resistances when turned on to effectively couple the capacitors 209 and/or 215 between the node 205 and ground.

When either of the transistors 213 and 219 is turned off, it is desired that the corresponding capacitor (209 and/or 215) be completely removed from the circuit as though not there at all. Theoretically, for example, it is desired to tri-state the nodes 211 and 217 to a sufficiently high impedance resulting in as little current flow as possible through the capacitors 209 and 215 and/or the transistors 213 and 219 when turned off. When the transistors 213 and 219 are turned off, however, they tend to leak appreciable charge from either of the nodes 211 or 217. The leakage current effectively alters the capacitance of the node 205 and compromises the intended filter transfer function. The gate leakage is an undesired dynamic function that cannot be compensated by simply modifying or adjusting capacitive values. Instead, it is desired to eliminate or otherwise mitigate leakage to achieve maximal filter function operation and efficiency.

Pass gates may be used to switch the programmable capacitors in and out of the circuit rather than the transistors 213 and 219. Pass gates may provide reduced resistance when turned on, but suffer from even worse leakage effects when turned off since employing back-to-back transistor devices with dual gates. The switch and capacitors may be reversed so that the switch is coupled to the node 205 and the capacitor to ground, but this configuration provides at least as bad and potentially worse leakage effects on node 205 thereby further compromising the voltage level of VCTRL.

In the embodiment illustrated, a buffer or operational amplifier 221 is provided, having its non-inverting or positive (+) terminal coupled to node 205 and its inverting or negative (−) terminal coupled to its output, which is further coupled to a node 223. The amplifier 221 is configured as a unity gain amplifier that maintains the voltage of the node 223 at the same voltage as the node 205. As shown, the node 223 is labeled VCTRLL', which is kept at the same voltage as node 205, or VCTRLL'=VCTRL. As understood by those skilled in the art, the voltage level of VCTRL is adjusted up and down by the main charge pump 201 to control the frequency of the VCO 109, so that the amplifier 221 drives node 223 to follow node 205 so that VCTRLL' is substantially equal to VCTRL during operation. Node 223 is further coupled to one switched or controlled terminal of each of a pair of pass gates 225 and 227. The other switched terminal of the pass gate 225 is coupled to node 211 and the other switched terminal of the pass gate 227 is coupled to node 217. The pass gates 225 and 227 each include a P-channel device and an N-channel device having their drain and sources coupled together (e.g., drain-to-source and source-to-drain) forming a pair of switched (or controlled, e.g., drain-source) terminals. The gates of the pass gate transistors form control terminals for turning on and off the pass device. Each pass gate is turned fully on when the gate of the N-channel device is pulled high and the gate of the P-channel device is pulled low, and is turned fully off when the gate of the N-channel device is pulled low and the gate of the P-channel device is pulled high. Thus, the control terminals of each pass gate receive complementary signals for switching the pass gate on and off. As shown, the P-channel control terminal of the pass gate 225 receives the CS0 signal and the P-channel control terminal of the pass gate 227 receives the CS1 signal. The CS0 signal is provided to the input of an inverter 229, having its output coupled to the N-channel control terminal of the pass gate 225, and the CS1 signal is provided to the input of an inverter 231, having its output coupled to the N-channel control terminal of the pass gate 227. In this manner, the pass gate 225 is turned fully off when the CS0 signal is asserted low and is turned fully on when CS0 is asserted high, and the pass gate 227 is turned fully off when the CS1 signal is asserted low and is turned fully on when CS1 is asserted high.

In operation, the CS0 signal is asserted high to turn on the transistor 213 and couple the capacitor 209 between node 205 and ground and thus in parallel with the capacitor 207. When the CS0 signal is asserted high, the pass gate 225 is turned off so that the output of the amplifier 221 is decoupled from node 211. When the CS0 signal is asserted low to turn off the transistor 213 to remove the capacitor 209 from the circuit, the pass gate 225 is turned on. The amplifier 221 thus drives node 211 to the same potential as the node 205, namely VCTRL (since coupled to VCTRL' via 225). Since the voltage across the capacitor 209 remains zero or negligible even as VCTRL is modified, the capacitor 209 is effectively removed from the circuit. Also, any gate leakage of the transistor 213 is driven by the amplifier 221 and does not effect circuit operation. The amplifier 221, therefore, mitigates any leakage of the transistor 213 and enables intended operation of removing the effects of the capacitor 209 from the node 205. The amplifier 221 mitigates leakage of the transistor 219 in the same manner when the CS1 signal is asserted low turning off the transistor 219, since the pass gate 227 is turned on and leakage by the transistor 219 is driven by the amplifier 221 instead of being provided by the node 205 and/or the capacitor 215. The amplifier 221 maintains the node 217 at the same potential as the node 205, namely VCTRL (since coupled to VCTRL' via 227), thereby removing the capacitor 215 from the circuit and compensating for any leakage effects of the transistor 219.

In general, the amplifier 221, the transistors 213 and 219 and the pass gates 225 and 227 collectively form a control circuit that selectively couples the other terminal of either capacitor 209 or 215 to ground when the capacitor is selected and that drives the other terminal to the same voltage as the node 205 when said capacitor is not selected.

The parameters or characteristics of the transistors 207, 209 and 215 (e.g., size, channel width, etc.) are designed in the given process to provide any practicable desired capacitance as known to those skilled in the art. It is known that capacitors implemented by MOS transistors exhibit nonlinearities and are process-dependent. Yet MOS transistors are a suitable solution for bias, reference or otherwise relatively stable DC voltage levels. Although the VCTRL signal does vary, it is a relatively stable DC voltage so that MOS transistors provide a suitable solution for implementing the programmable or switched capacitances. Alternatively, any one or more of the capacitors 207, 209 and 215 may be implemented according to any other technique or process, such as metal capacitors having metal comb structures that span multiple metal levels in an integrated circuit implementing the programmable filter 107.

The capacitor 207 is shown as fixed but may also be coupled in similar fashion as the capacitors 209 and 215 so that all capacitors are selectively "programmable" or switched in or out of the circuit. Furthermore, although only two programmable capacitors 209 and 215 are shown for purposes of illustration, this it is understood that any practicable number of programmable capacitors (one or more) may be included within any given filter design. The pass gates 225 and 227 may be implemented using relatively small devices to save space and to conserve power. Various embodiments are contemplated for implementing the select signals depending upon the particular application or configuration. The select signals may be hardwired or programmable via logic or a register or the like. The programmable function may be automatic and dynamically configurable in one configuration or statically programmable (e.g., by circuitry or a user or the like) in another configuration.

Although an anti-gate leakage programmable capacitor is shown implemented in the filter of a charge pump of a PLL, it is appreciated that it may be implemented in any application or filter function configuration and is not limited to PLLs and the like. The present invention may be employed in any circuit in which it is desired to program the capacitance between any two nodded in which the voltage across unused capacitances is maintained at zero by a unity gain amplifier or the like.

Figure 3:
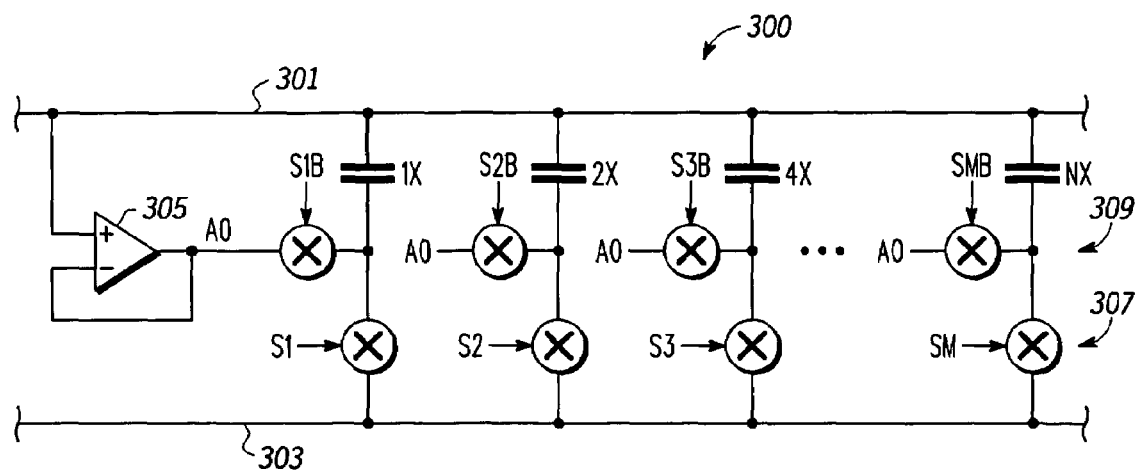
FIG. 3 is a schematic diagram of a programmable capacitor implemented according to an exemplary embodiment of the present invention employing an array of binary-weighted capacitances.

The "weight" or relative capacitance of the capacitors may be distributed in any manner to facilitate convenient programmability for any application, such as, for example, an array of binary-weighted capacitors. FIG. 3 is a schematic diagram of a programmable capacitor 300 implemented according to an exemplary embodiment of the present invention employing an array of binary-weighted capacitances. The programmable capacitor 300 includes a parallel array of a number M of binary-weighted capacitors 1×, 2×, 4×, ..., N×, where $N=2^{M-1}$, and where each capacitor has a first terminal coupled to a first node 301 and a second terminal. In this example, an "X" denotes a multiple of a common capacitor value selected by the designer for the particular application and process. An array of first switches 307 each have switched terminals coupled between a second terminal of a corresponding capacitor and a second node 303, where each of the switches 307 are controlled by a corresponding one of a set of select signals S1, S2, S3, ..., SM. A unity gain amplifier 305 is coupled to the node 301 and provides an output AO having a voltage level equal to the voltage of node 301. Another array of second switches 309 each have switched terminals coupled between the output AO of the amplifier 305 and a second terminal of a corresponding capacitor. The switches 309 are controlled by inverted versions of the select signals, shown as S1B, S2B, S3B, ..., SMB. Each complementary pair of select signals may be achieved using an array of inverters or may be implemented in any other manner as known to those skilled in the art. The number of programmable states may be doubled simply by adding one more binary-weighted capacitor stage in the array.

In one aspect of the present invention, an anti-gate leakage programmable capacitor includes at least one capacitor having a first terminal coupled to a first node and a second terminal, a second node, and a control circuit coupled to the second terminal of each capacitor and the second node. The control circuit selectively couples the second terminal to the second node when the capacitor is selected or drives the second terminal to the same voltage as the first node when the capacitor is not selected. In one embodiment, the control circuit includes a unity gain amplifier having an input coupled to the first node and an output, at least one first switch having a first current terminal coupled to a second terminal of the capacitor, a second current terminal coupled to a second node and a control terminal receiving a select signal, and at least one second switch having a first current terminal coupled to the second terminal of the capacitor, a second current terminal coupled to the output of the amplifier and a control terminal receiving the select signal. The first and second switches are controlled by the select signal to selectively couple the second terminal of the capacitor to either one of the second node and the output of the amplifier.

The capacitor may be implemented in any suitable fashion, such as a metal-oxide semiconductor (MOS) transistor configured as a capacitor. The unity gain amplifier may be implemented as an operational amplifier having its non-inverting input coupled to the first node and an inverting input coupled to the output of the amplifier. The first switch may be implemented in any suitable fashion, such as a MOS transistor having its drain and source coupled between a second terminal of the capacitor and the second node and having a gate receiving the select signal. The second switch may also be implemented in any suitable fashion, such as a pass gate having current terminals coupled between a second terminal of the capacitor and the output of the amplifier, and having a complementary pair of control terminals receiving the select signal and an inverted select signal. An inverter may be provided to invert the select signal to provide a complementary pair of select signals.

Multiple capacitors and switches may be provided, each coupled together in substantially the same way and receiving a corresponding select signal. Each pair of first and second switches is controlled by a corresponding select signal to selectively switch a second terminal of a corresponding capacitor to either one of the second node and the output of the amplifier. The capacitors may collectively form a binary-weighted set of capacitances.

In another aspect of the present invention, a method of minimizing gate leakage of programmable capacitor having multiple capacitors coupled to a first node and a corresponding multiple of first switches coupled to a second node, where each capacitor and first switch pair are coupled in series between the first and second nodes forming multiple intermediate junctions, includes driving a third node with an amplifier to a voltage level substantially equal to the voltage of the first node, activating selected ones of the first switches to select corresponding capacitors, and coupling the intermediate junction of each unselected capacitor to the third node. The method may include coupling an input of a unity gain amplifier to the first node and coupling the output of the amplifier to the third node. The method may include turning on selected MOS transistors coupled to the capacitors. The method may include activating a corresponding second switch coupled between the intermediate junction and the third node, such as turning on a corresponding pass gate.

In another aspect of the invention, a phase locked loop (PLL) circuit includes a phase frequency detector having a first input receiving a first clock, a second input receiving a second clock, and at least one output providing at least one clock control signal, a charge pump having at least one input receiving the clock control signal and an output coupled to a frequency control voltage node having a controlled voltage relative to a reference node, a voltage controlled oscillator (VCO) having an input coupled to the frequency control voltage node and an output that provides the second clock, and a programmable filter circuit, coupled between the frequency control voltage node and the reference node. The programmable filter circuit includes multiple capacitors, each having a first terminal coupled to the frequency control voltage node and a second terminal, an amplifier having an input coupled to the frequency control voltage node and an output, and a switch circuit, coupled to the reference node, to each second terminal of each capacitor and to the amplifier output, that selectively switches each second terminal of each capacitor between the amplifier output and the reference node. The switch circuit may include a pair of first and second switches for each capacitor, where each pair of switches is controlled by a corresponding select signal to selectively switch a second terminal of a corresponding capacitor between the reference node and the output of the amplifier.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An anti-gate leakage programmable capacitor, comprising:
    at least one capacitor having a first terminal coupled to a first node and a second terminal;
    a second node; and
    a control circuit, comprising:
    a amplifier circuit having an input coupled to said first node and an output, wherein said amplifier circuit drives its output to the same voltage as said first node; and
    a switch circuit, coupled to said output of said amplifier circuit, said second node and said second terminal of said capacitor, wherein said switch circuit selectively couples said second terminal of said at capacitor to said second node when said capacitor is selected and selectively couples said second terminal of said capacitor to said output of said amplifier circuit when said capacitor is not selected.

2. The anti-gate leakage programmable capacitor of claim 1, wherein said capacitor comprises a metal-oxide semiconductor transistor configured as a capacitor.

3. The anti-gate leakage programmable capacitor of claim 1, wherein said control circuit comprises:
    said amplifier circuit comprising a unity gain amplifier having an input coupled to said first node and an output; and
    said switch circuit comprising:
        at least one first switch having a first current terminal coupled to said second terminal of said capacitor, a second current terminal coupled to said second node and a control terminal receiving a select signal; and
        at least one second switch having a first current terminal coupled to said second terminal of said capacitor, a second current terminal coupled to said output of said amplifier and a control terminal receiving said select signal;
        wherein said first and second switches are controlled by said select signal to selectively couple said second terminal of said capacitor to either one of said second node and said output of said unity gain amplifier.

4. The anti-gate leakage programmable capacitor of claim 3, wherein said unity gain amplifier comprises an operational amplifier having an output, having a non-inverting input coupled to said first node, and having an inverting input coupled to said output of said operational amplifier.

5. The anti-gate leakage programmable capacitor of claim 3, wherein said at least one first switch comprises a metal-oxide semiconductor transistor having a drain and source coupled between a second terminal of said capacitor and said second node and having a gate receiving said select signal.

6. The anti-gate leakage programmable capacitor of claim 3, wherein said at least one second switch comprises a pass gate having current terminals coupled between a second terminal of said capacitor and said output of said amplifier, and having a complementary pair of control terminals receiving said select signal and an inverted select signal.

7. The anti-gate leakage programmable capacitor of claim 3, wherein:
said at least one capacitor comprises a plurality of capacitors, each having a first terminal coupled to said first node and a second terminal;
said at least one first switch comprising a plurality of first switches, each having a first current terminal coupled to a second terminal of a corresponding capacitor, a second current terminal coupled to said second node and a control terminal receiving a corresponding one of a plurality of select signals; and
said at least one second switch comprising a plurality of second switches, each having a first current terminal coupled to a second terminal of a corresponding capacitor, a second current terminal coupled to said output of said amplifier and a control terminal receiving a corresponding select signal;
wherein each pair of said plurality of first and second switches is controlled by a corresponding select signal to selectively switch a second terminal of a corresponding capacitor to either one of said second node and said output of said amplifier.

8. The anti-gate leakage programmable capacitor of claim 7, wherein said plurality of capacitors collectively form a binary-weighted set of capacitances.

9. A phase locked loop (PLL) circuit comprising:
a phase frequency detector having a first input receiving a first clock, a second input receiving a second clock, and at least one output providing at least one clock control signal;
a charge pump having at least one input receiving said clock control signal and an output coupled to a frequency control voltage node having a controlled voltage relative to a reference node;
a voltage controlled oscillator (VCO) having an input coupled to said frequency control voltage node and an output that provides said second clock; and
a programmable capacitor, coupled between said frequency control voltage node and said reference node, comprising:
a plurality of capacitors, each having a first terminal coupled to said frequency control voltage node and a second terminal;
an amplifier having an input coupled to said frequency control voltage node and an output; and
a switch circuit, coupled to said reference node, to each second terminal of each of said plurality of capacitors and to said amplifier output, that selectively switches each second terminal of each capacitor between said amplifier output and said reference node.

10. The PLL of claim 9, wherein said switch circuit comprises:

a plurality of first switches, each having a first current terminal coupled to a second terminal of a corresponding one of said plurality of capacitors, a second current terminal coupled to said reference node and a control terminal receiving a select signal; and
a plurality of second switches, each having a first current terminal coupled to a second terminal of a corresponding capacitor, a second current terminal coupled to said output of said amplifier and at least one control terminal receiving a corresponding one of said plurality of select signals;
wherein each pair of said plurality of first and second switches is controlled by a corresponding one of said plurality of select signals to selectively switch a second terminal of a corresponding capacitor between said reference node and said output of said amplifier.

11. The PLL of claim 10, wherein each first switch comprises a metal-oxide semiconductor transistor and wherein each second switch comprises a MOS pass gate receiving a complementary pair of select signals.

12. The PLL of claim 9, wherein each of said plurality of capacitors comprises a metal-oxide semiconductor transistor having its drain and source coupled to its substrate.

13. The PLL of claim 9, wherein said amplifier comprises a unity gain amplifier.

14. A method of minimizing gate leakage of a programmable capacitor having a plurality of capacitors coupled to a first node and a corresponding plurality of first switches coupled to a second node, wherein each capacitor and first switch pair are coupled in series between the first and second nodes forming a plurality of intermediate junctions, said method comprising:
driving a third node to a voltage level substantially equal to the voltage of the first node;
activating selected ones of the first switches to selectively couple corresponding capacitors to the second node; and
coupling the intermediate junction of each unselected capacitor to the third node.

15. The method of claim 14, wherein said driving a third node comprises coupling an input of a unity gain amplifier to the first node and coupling the output of the amplifier to the third node.

16. The method of claim 14, wherein said activating selected ones of the first switches comprises turning on selected ones of a plurality of metal-oxide semiconductor (MOS) transistors coupled to said plurality of capacitors.

17. The method of claim 16, wherein said turning on selected ones of a plurality of MOS transistors comprises asserting a selected combination of select signals.

18. The method of claim 14, wherein said coupling the intermediate junction of each unselected capacitor to the third node comprises activating a corresponding second switch coupled between the intermediate junction and the third node.

19. The method of claim 18, wherein said activating a corresponding second switch coupled between the intermediate junction and the third node comprises turning on a corresponding pass gate.

20. The method of claim 19, wherein said turning on a corresponding pass gate comprises asserting complementary select signals.

* * * * *